United States Patent [19]

Tanimura et al.

[11] 3,952,323

[45] Apr. 20, 1976

[54] SEMICONDUCTOR PHOTOELECTRIC DEVICE

[75] Inventors: Shigeru Tanimura, Kyoto; Nobuaki Miura, Oita; Mikizo Miyamoto, Nagaokakyo, all of Japan

[73] Assignee: Omron Tateisi Electronics Co., Ltd., Japan

[22] Filed: Aug. 14, 1973

[21] Appl. No.: 388,148

[30] Foreign Application Priority Data

Aug. 17, 1972 Japan............................... 47-82376

[52] U.S. Cl.................................. 357/15; 357/16; 357/17; 357/23; 357/60
[51] Int. Cl.²................. H01L 29/48; H01L 29/56
[58] Field of Search ............... 317/234, 5, 5.4, 235, 317/31, 60, 238

[56] References Cited
UNITED STATES PATENTS

| | | | |
|---|---|---|---|
| 3,106,489 | 10/1963 | Lepselter | 317/234 J |
| 3,391,282 | 7/1968 | Kabell | 317/235 N |
| 3,457,473 | 7/1969 | Okada et al. | 357/15 |
| 3,596,151 | 7/1971 | Eldridge | 317/235 N |
| 3,679,949 | 7/1972 | Uekusa et al. | 317/238 |
| 3,742,317 | 6/1973 | Shao | 317/235 UA |
| 3,760,240 | 9/1973 | Bergt | 317/235 N |

OTHER PUBLICATIONS

Solid–State Electronics, *Metal–Silicon Schottky Barriers,* by Turner, Vol. No. 3 pp. 291–300 Mar. 1968.

*Primary Examiner*—Andrew J. James
*Attorney, Agent, or Firm*—Staas & Halsey

[57] ABSTRACT

A semiconductor photoelectric device of improved photoelectric and rectifying characteristics is provided by first forming a film or silicon dioxide on a main surface, having a crystallographic orientation of (100), of a semiconductor substrate of N-type silicon, the film being formed to a thickness less than 25A., for example, and then further depositing thereon a tin oxide film. It was found that adoption of the abovementioned (100) orientation reduces the reverse saturation current and thus the dark current of the device, with the result that the open voltage of the device is accordingly increased. It was also found that proper choice of specific resistivity of the substrate improves linearity of the photoelectric characteristic.

13 Claims, 9 Drawing Figures

SEMICONDUCTOR PHOTOELECTRIC DEVICE

BACKGROUND OF THE INVENTION

1. Field of the invention

The present invention relates to a semiconductor photoelectric device, and more specifically to an improved semiconductor photoelectric device utilizing a semiconductor composite comprising a tin oxide film deposited on a semiconductor substrate and having a rectifying characteristic.

2. Description of the Prior Art

One of the typical existing photoelectric devices made of semiconductor materials is a silicon photoelectric device. As is well known, the silicon photoelectric device is manufactured by forming a P-type diffused layer or a thickness of a few microns or less on the surface of an N-type silicon substrate so that when the light impinges on the P-N junction formed therebetween, photovoltaic energy is generated between the P-type layer and the N-type layer. Also it is well known that the conductivity type of the respective layers may be reversed depending upon the application.

However, this type of silicon photoelectric device is disadvantageous in that the device is expensive as compared with other types of photoelectric devices, such as cadmium sulfide photoelectric devices, mainly because manufacture of the silicon photoelectric devices necessitates a diffusion process which should be carried out at a high temperature and under a delicately controlled condition. Another disadvantage of a silicon photoelectric device is that it is of reduced sensitivity in the short wavelength region of its spectral characteristics due to the fact that light energy greater than the forbidden band of energy of the semiconductor does not transmit through the semiconductor to the P-N junction, which usually is formed at a certain distance from the surface of the semiconductor. Thus, it is essential to make the abovementioned diffused layer extremely thin, preferably as thin as 0.3 micron in order to implement such a device which is sufficiently sensitive to the shorter wavelength region as well. Nevertheless, formation of a thin diffused layer calls for a high level of diffusion techniques, again resulting in a high cost of this type of device.

If the diffused layer of such silicon photoelectric device could be replaced with a transparent conductive film or metal oxide and if such film could serve the same function as that of the diffused layer, the cost of manufacturing a photoelectric device would be greatly reduced and the resultant device could have a greater scope of application. Of interest in this connection is U.S. Pat. No. 3,679,949, entitled "SEMICONDUCTOR HAVING TIN OXIDE LAYER AND SUBSTRATE", issued July 25, 1972 to Genzo Uekusa et al. and assigned to the same assignee of the present invention. The referenced patent basically discloses a semiconductor composite comprising a film of tin oxide ($SnO_2$) deposited on a semiconductor substrate such as silicon and having rectifying and photoelectric characteristics therebetween.

More specifically, the referenced patent discloses such composite obtained by a process comprising the steps of heating an N-type silicon single crystal substrate in a quartz tube, and introducing a vapor of a tin salt such as dimethyl tin dichloride ($(CH_3)_2SnCl_2$) into said quartz tube for depositing a tin oxide film on said silicon substrate by pyrolysis. Such composite comprises a barrier formed between the tin oxide film and the silicon substrate, which barrier is presumably a Schottky barrier and closely resembles a P-N junction in a rectifying characteristic. Such barrier may be advantageously utilized as a rectifying device or photoelectromotive force device. As is well known, the tin oxide film is transparent and conductive. Hence, by so adapting the composite that the light is applied to said barrier through the tin oxide film, a photoelectric device is provided. The spectral characteristic of such photoelectric device is such that it is more highly sensitive in the visible wavelength region as compared with a conventional silicon photoelectric device. It also exhibits a higher output at lower illumination, and is satisfactory in temperature characteristic and response characteristic. Another advantage of the referenced patent composite is that the composite can be provided with ease and less cost on a mass production basis in view of the fact that the tin oxide layer may be deposited at a lower temperature as compared with a process employed in manufacture of the silicon photoelectric device.

Preferably silicon is employed as a semiconductor substrate material in manufacturing the referenced patent composite. It should be pointed out, however, that the surface of the silicon substrate is likely to be oxidized even at a normal temperature and as a result the silicon substrate as prepared for manufacture of semiconductor devices usually comprises a thin oxide film formed on the surface thereof. Such oxide film typically comprises $SiO_2$. Again it should be pointed out that an additional oxide film is formed on the surface of the substrate in the course of further depositing a tin oxide film on the surface. As a result it was found that the semiconductor composite prepared in accordance with the teaching in the said referenced patent usually comprises a very thin insulating film, typically of $SiO_2$, of a thickness of a few A. to approximately 10A. incidentally formed between the tin oxide film and the substrate. Thus it would be readily understood that such undesired intervening layer of insulating film is inevitably formed, unless consideration is given to eliminate such undesired layer.

With a view to investigating in detail what influence the $SiO_2$ layer incidentally formed between the $SnO_2$ layer and the Si substrate has upon performance of the $SnO_2$—Si heterojunction of the composite, an experiment was carried out, in which removal was first made of the $SiO_2$ layer formed on the substrate surface through natural oxidization of the substrate material and then deposition was made of an $SnO_2$ layer on the fresh surface of the substrate by a process and means for eliminating formation of an $SiO_2$ layer on the substrate surface during deposition of the $SnO_2$ layer, so that a new composite was provided, which comprises no substantial $SiO_2$ layer between the $SnO_2$ layer and the substrate of the composite. It was observed that the resultant $SnO_2$-Si composites lack uniformity in reverse breakdown voltage, and have an increased reverse leakage current and a lowered reverse breakdown voltage. As is well known to those skilled in the art, these changes in characteristics with respect to the referenced patent composite are all disadvantageous in various applications of the semiconductor device. Thus the fact was confirmed that formation of the $SiO_2$ film at a junction region of the the $SnO_2$-Si composite as a significant influence upon the characteristics of the semiconductor device.

Nevertheless, the fact was also confirmed by experiment that the thickness of the SiO₂ film incidentally formed in the SnO₂—Si composite manufactured in accordance with the teaching in the referenced patent does not exceed 15A. It is believed that usually such a very thin SiO₂ layer does not cover the whole surface of the silicon substrate; or instead the substrate surface is studded with a plurality of small SiO₂ film areas with irregularities of the film thickness and other film conditions. For this reason it is extremely difficult to provide SnO₂—Si composites of uniform in characteristics as a semiconductor device, resulting in an unsatisfactory yield rate of manufacture of the device.

Another semiconductor photoelectric device of interest, which has a different structural feature, is disclosed in U.S. patent application, Ser. No. 304,809, entitled "SEMICONDUCTOR DEVICE", filed Nov. 8, 1973, by Shigeru Tanimura et al. and assigned to the same assignee of the present invention. Briefly stated, the referenced application discloses a semiconductor composite comprising a semiconductor substrate, an insulating film formed on said semiconductor substrate and a film of a tin oxide, preferably stannic oxide (SnO₂), deposited on said insulating film and having a rectifying characteristic. Preferably the material of said semiconductor substrate is selected from the group consisting of Si, Ge and GaAs. Preferably the material of said insulating film is selected from the group consisting of SiO₂, Si₃N₄ and GeO₂. A thickness of the insulating film is chosen to be in the range of 15A. to 500A, but preferably a thickness of the insulating film is chosen to be in the range of 27A. to 300A. and more preferably 27A. to 100A.

Such a composite can be used as an ordinary rectifier without any incidental radiation energy and, with its SnO₂ layer as a light receiving side, can be used as a photoelectric device. However, other applications of the referenced application are a voltage controlled switching device ad a light controlled switching device. More specifically, it was discovered that the composite, as subjected to radiation energy of a certain value, if a thickness of the SiO₂ film is chosen to be a particular value range, say 2A. to 500A., shows an excellent voltage response to a reverse bias voltage applied to the composite. Thus, the composite as subjected to a predetermined value of radiation energy may be used as a switching device which is operable as a function of the voltage applied to the composite in a reverse direction. It was also discovered that the composite as supplied with a certain value of a reverse bias voltage or with no bias, if a thickness of the SiO₂ film is chosen to be a particular value range, say 27A. to 500A., shows an excellent radiation response in a reverse current to radiation energy applied to the composite. Thus, the composite may be used as a switching device which is operable as a function of the radiation energy applied to the composite.

One of the most advantageous features of the devices disclosed in the referenced patent and the referenced patent application as compared with the conventional silicon photoelectric devices is that the referenced photoelectric device comprising an SnO₂—Si composite or SnO₂—SiO₂—Si composite shows a remarkably improved photosensitivity even at low illumination, while such photoelectric device can also respond to illumination higher than the limit of the conventional silicon P-N junction device. More specifically, the referenced photoelectric device can respond to illumination of a range from as low as $10^{-3}$ lux to as 100,000 lux, while the conventional silicon P-N junction device can only cover an illumination range from $10^{-2}$ lux to 30,000 lux at the best. In particular, good use can be made of the high sensitivity response at low illumination levels of the referenced device.

Typical requirements of a semiconductor photoelectric device are such that a dark current is small in consideration of using the device at low illumination and that an open voltage of the device as subjected to radiation energy is high. It is well known that generally a dark current of a semiconductor diode is closely related to a reverse saturation current and thus the dark current is reduced by making small the reverse saturation current. This is understood by the following equation, which expresses a rectifying characteristic.

$$Id = Io\, (1 - e^{-qV/nkT})$$

where $Id$ is a dark current, $Io$ is a reverse saturation current, V is a reverse bias voltage, $q$ is an elementary electric charge, $n$ is a junction coefficient, $k$ is a Boltsman constant, and T is a temperature of the device.

On the other hand, it is also known that the reverse saturation current $Io$ is related to a barrier height of the junction of the device. Generally, the higher the height of the junction barrier is, the smaller the reverse saturation current $Io$ becomes. This relation is expressed by the following equation.

$$Io = q \cdot Vth \cdot N \cdot e^{-qV_D/nkT}$$

where N is carrier density in a silicon substrate, $Vth$ is velocity of the carriers caused by heat energy, and $V_D$ is a height of the junction barrier.

It has further been known that photoelectromotive force or an open voltage becomes higher as the reverse saturation current is made small. This relation is expressed by the following equation.

$$Vop = \frac{nkT}{q} \ln\left(1 + \frac{I_L}{Io}\right)$$

where $Vop$ is an open voltage and $I_L$ is a light current.

In view of the above discussion, it is seen that it is desired to provide an improved photoelectric device of the referenced prior art type wherein a reverse saturation current is made small.

In some applications of the referenced prior art device, it is often required to provide a device capable of generating an output current of a sufficient value. For this purpose, those skilled in the art might simply think of implementing a composite of an increased light receiving barrier area. As a result of experimentation, however, it was found that in the referenced prior art composite an increase of the barrier area in a single light receiving region does not bring a linearly proportional reverse dark current but rather causes a much more increased reverse dark current than expected. It was also found that a light current in terms of per square of the composite subjected to illumination is decreased, possibly because of an increased series resistance across the increased barrier area. Thus it was observed that a signal-noise ratio of the referenced prior art composite is degraded, as the barrier area for light receipt in a single region is increased. Such a disadvantage is particularly aggravated in utilizing the composite at low illumination.

SUMMARY OF THE INVENTION

Briefly stated, the present invention provides a semiconductor photoelectric device comprising a silicon substrate having a main surface having a crystallographic of (100), a thin insulating film deposited on said main surface of the substrate, and a film of tin oxide, preferably stannic oxide ($SnO_2$), further deposited on said silicon dioxide film and having a photoelectric and rectifying characteristics. Preferably, the material of said insulating film may be selected from a group consisting of $SiO_2$, $Si_3N_4$, $GeO_2$ and $Al_2O_3$. The thickness of the insulating film may be chosen to be less than 30A., but preferably to be 15A. to 25A. and more preferably to be 20A. to 25A.

It was found that adoption of the abovementioned (100) orientation reduces a reverse saturation current and thus a dark current of the device, with the result that an open voltage on the device is accordingly increased. It was also found that proper choice of specific resistivity of the substrate improves linearity of the photoelectric characteristic. As a result of experimentation, it is preferred to choose the specific resistivity of the substrate to be 1 to 20 ohm cm and more preferably to be 5 to 15 ohm cm and most preferably to be 7 to 13 ohm cm.

Therefore, an object of the present invention is to provide an improved semiconductor composite having a rectifying characteristic which comprises an $SnO_2$ film deposited on a silicon substrate.

Another object of the present invention is to provide a semiconductor photoelectric device comprising an $SnO_2$ film deposited on a silicon substrate, and having a decreased dark current.

A further object of the present invention is to provide a semiconductor photoelectric device comprising an $SnO_2$ film deposited on a silicon substrate, and having a decreased reverse saturation current.

Still a further object of the present invention is to provide a semiconductor photoelectric device comprising an $SnO_2$ film deposited on a silicon substrate, and having a higher open voltage.

A further object of the present invention is to provide a semiconductor photoelectric device comprising a $SnO_2$ film deposited on a silicon substrate, and having an improved linearity of the short circuit current characteristic at a higher illumination range.

These and other objects, aspects and features of the present invention will be better understood from the following detailed description in conjunction with the acompanying drawings.

DESCRIPTION OF THE PREFERRED EMBODIMENTS

Figure 1:
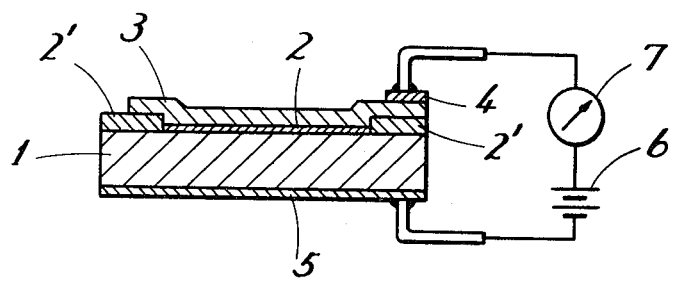
FIG. 1 is a sectional view of a semiconductor composite of the present invention.

Referring to FIG. 1, there is shown a sectional view of a semiconductor composite of the present invention. The composite shown comprises a film 2' of electrically insulating material such as silicon dioxide of a sufficient thickness, say 0.6$\mu$, formed on a portion of the main surface of the semiconductor substrate 1, another film 2 or an insulating material such as silicon dioxide of 15A. to 30A. formed on an area of said semiconductor substrate 1 through an opening defined by said film 2' and a tin oxide film 3 further deposited on said films 2 and 2', a rectifying barrier being formed between said semiconductor substrate 1 and the tin oxide film 3. The barrier thus formed is confined by said insulating film 2' and is not exposed and hence a favorable characteristic of the device is ensured. The composite is also shown comprising a metal electrode 4 formed on the $SnO_2$ layer 3, a metal electrode 5 formed on the substrate 1 and a circuit connection, including an ammeter 7 and a reverse bias voltage source 6 connected to both electrodes 4 and 5. The $SnO_2$ layer 3 or the composite is so chosen as to be well conductive and constitutes itself an N-type semiconductor. The conductivity of this $SnO_2$ layer is close to that of a metal, say about $10^{20}$ atoms/cm$^3$ in terms of free electron concentration. The $SnO_2$ layer 3 having the characteristic of N-type semiconductor can be formed by a rapid chemical reaction yielding $SnO_2$. This is presumably accounted for by the excess of metal or shortage of oxygen resulting from the rapidity of the progress of reaction.

As more fully described in the referenced patent, it was discovered that a composite of such structure and composition has a rectifying characteristic and that such composite takes on a photoelectric function when radiation energy is supplied to the heterojunction formed inside the composite. One of possible interpretations of the discovery is that such formation of heterojunction is actually formation of a Schottky barrier between said $SnO_2$ film 3 and the semiconductor substrate 1, with $SnO_2$ being regarded as a metal. It has been found that in place of the $SiO_2$ film 2 other insulating material such as $Si_3N_4$, $GeO_2$ or $Al_2O_3$ may be used.

As discussed in the foregoing, since the reverse saturation current $Io$ is related to the barrier height $V_D$ of the rectifying junction, it will be understood that enhancement of the barrier height will be an effective expedient for decreasing the reverse saturation current $Io$. Generally, the fact is presumed known to those skilled in the art that crystallographic orientation of the surface of the semiconductor substrate where a rectifying barrier is formed is one of the factors for determining the barrier height $V_B$. However, the most preferred orientation of the barrier surface differs greatly depending upon the structure and materials of the semiconductor device. The present inventors carried out experimentation with a view to finding out which of crystallographic orientations (111), (110) and (100) is most preferred for the barrier surface in implementing a device of the least reverse saturation current Io, which employs an $SnO_2$—$SiO_2$—Si composite. As a result, the orientation (100) was found most preferred in that the $SnO_2$—$SiO_2$—Si composite device of such orientation shows the least reverse saturation current Io and the highest open voltage.

Figure 2:
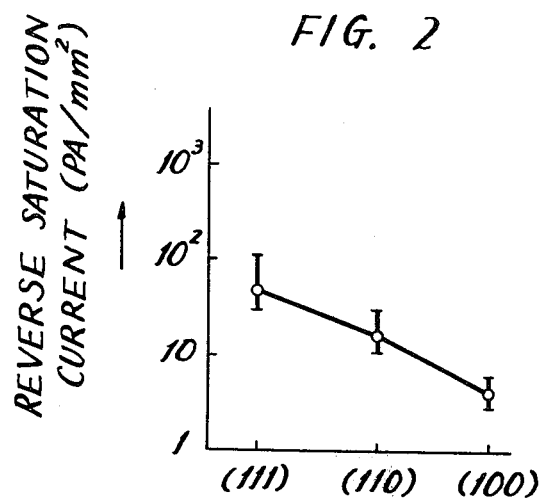
FIGS. 2 and 3 are graphs showing relations of reverse saturation current and open voltage, respectively, of the FIG. 1 composite with respect to various crystallographic orientations of the barrier surface of the composite.
Figure 3:
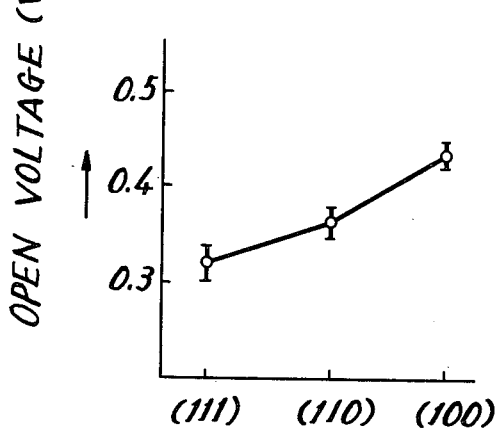

FIGS. 2 and 3 are graphs showing a relation of reverse saturation current and a relation of open voltage, respectively, of the FIG. 1 composite with respect to various crystallographic orientations of the barrier surface of the composite. With particular reference to FIG. 2, it should be noted that the reverse saturation current of the device of (100) orientation is reduced to as small as one tenth of that of the device of (111) orientation. It is to be pointed out that the characteristics of FIGS. 2 ans 3 were obtained using the FIG. 1 composite as subjected to illumination of 1000 lux wherein the specific resistivity of silicon substrate 1 is 1 ohm cm and a thickness of the $SiO_2$ film 2 is approximately 22A.

Figure 4:
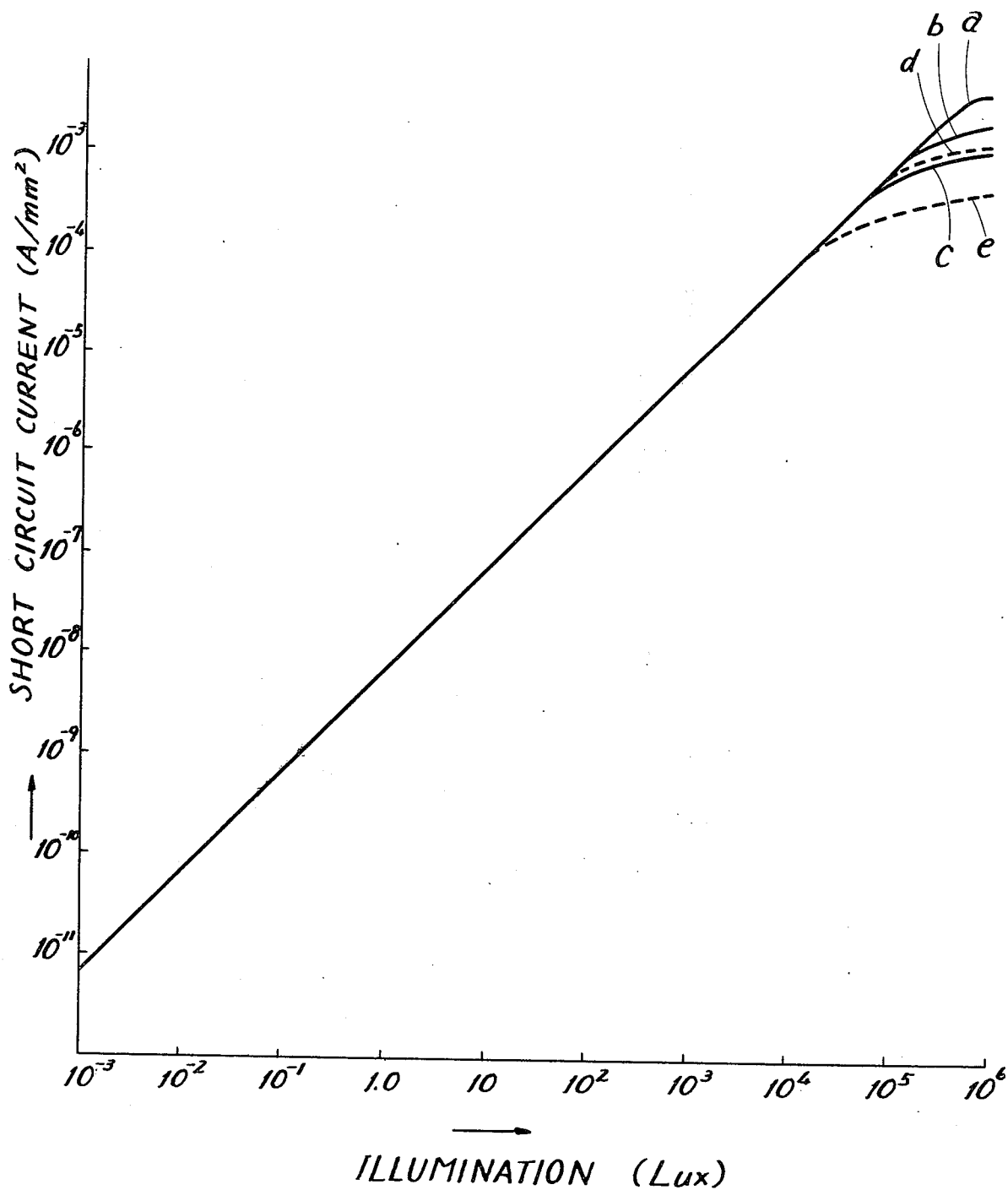
FIG. 4 is a graph showing a relation of a short circuit current versus illumination of the FIG. 1 composite employing (100) crystallographic orientation for a barrier surface of the substrate, with various values of specific resistivity of the substrate shown as a parameter.

FIG. 4 is a graph showing a relation of a short circuit current versus illumination of the FIG. 1 composite employing (100) crystallographic orientation for a barrier surface of the substrate, with various values of specific resistivity of the substrate shown as a parameter, in which the curves a, b and c are for devices of the specific resistivity of 1 ohm cm, 5 ohm cm and 10 ohm cm, respectively. For the purpose of comparison, similar curves d and e are shown in the graph to illustrate such characteristic of conventional diffusion type PN junction devices of 1 ohm cm and 10 ohm cm, respectively, in specific resistivity of the substrate. As seen from the graph, the inventive device, particularly of the curve a, shows a linear characteristic over so wide a range from as low as $10^{-3}$ lux to as high as $10^5$ lux, whereas the conventional PN junction device is liable to become saturated at illumination exceeding approximately $10^4$ lux.

Figure 5:
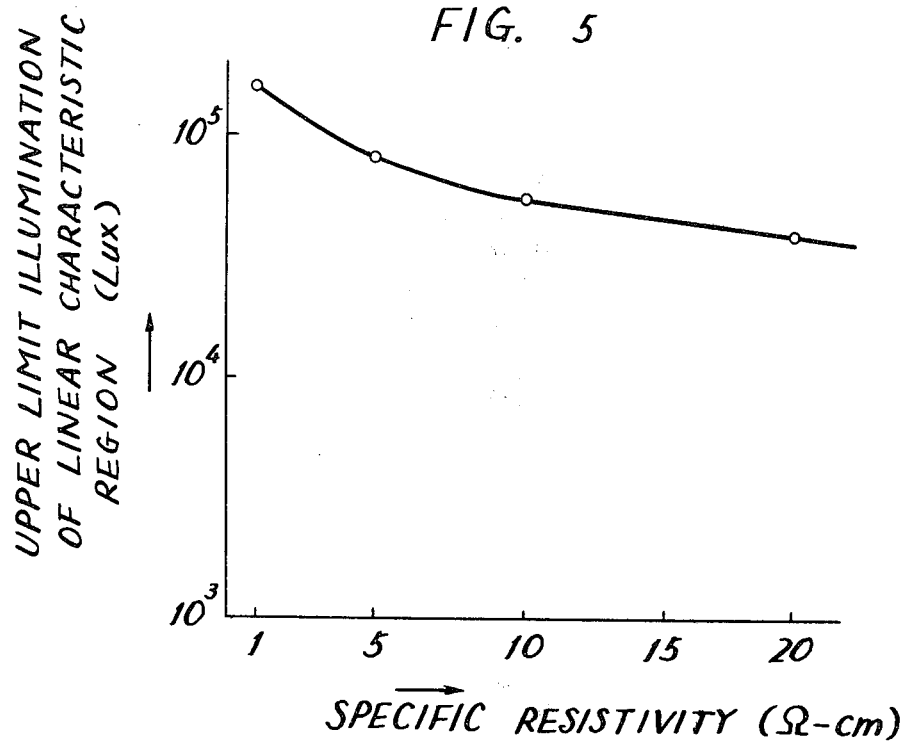
FIG. 5 is a graph showing a relation of an upper limit illumination of linear characteristic range versus specific resistivity of the substrate, based on FIG. 4 graph.

FIG. 5 is a graph showing a relation of an upper limit of illumination of the linear characteristic range for a composite as in FIG. 1 versus the specific resistivity of the substrate of the composite, based on FIG. 4 graph. It is seen from the graphs in FIGS. 4 and 5 that as the specific resistivity of the substrate is decreased, the linear characteristic range is expanded. Generally, the silicon substrate 1 is as thin as 0.2 mm in thickness and therefore, assuming that specific resistivity of the substrate is 10 ohm cm the series resistance per area of the diode is 0.2 ohm/cm$^2$, which is negligible in considering the effect of series resistance on the characteristic. Thus the differences in the upper limit of the linear characteristic, as seen in the graph, is believed to be caused by the difference of the barrier height due to the difference of the specific resistivity of the substrate.

Figure 6:
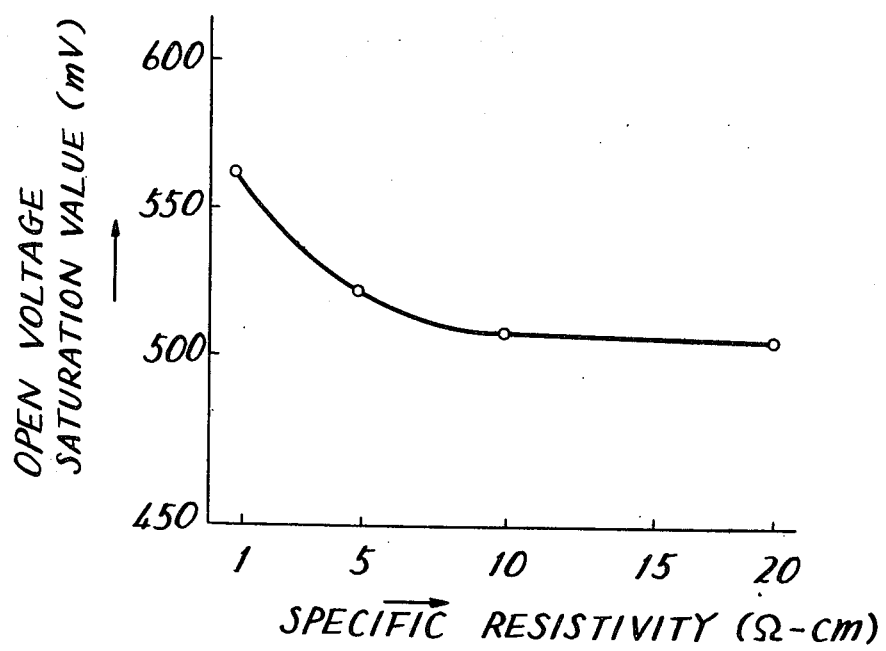
FIG. 6 is a graph showing a relation of a maximum open voltage (open voltage saturation value) with specific resistivity of the FIG. 1 composite.

FIG. 6 is a graph showing a relation of a maximum open voltage (open voltage saturation value) with specific resistivity. The graph shows that lower values of specific resistivity, particularly less than 5 ohm cm, for example, enhances the maximum open voltage, which presumably enhances the barrier height accordingly. Although the FIG. 6 graph seems to suggest employment of less specific resistivity as preferable, further consideration must be given to determine a preferred specific resistivity, as to be more fully described subsequently.

Figure 7:
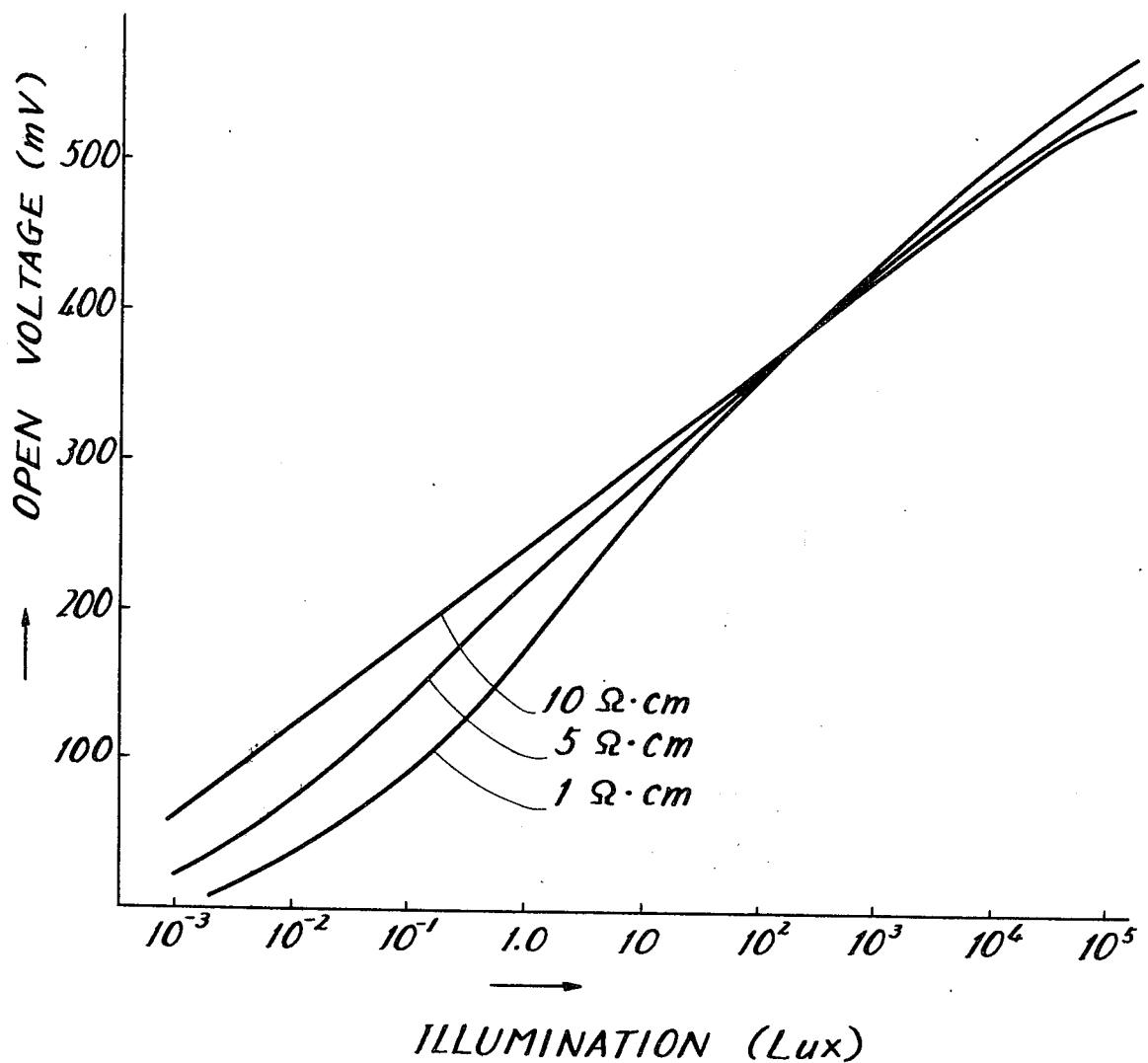
FIG. 7 is a graph showing a relation of an open voltage of the FIG. 1 composite of the (100) orientation versus illumination impinging upon the composite, with several values of specific resistivity as a parameter.

FIG. 7 is a graph showing a relation of an open voltage of the FIG. 1 composite of (100) orientation versus illumination impinging upon the composite, with several values of specific resistivity as a parameter. As seen from the graph, less specific resistivity of the substrate makes lower the open voltage in a range of low illumination, although it makes slightly higher the open voltage in a range of high illumination. Taking this into consideration in totality together with illuminations in FIGS. 5 and 6, it is preferred to choose the specific resistivity to be 1 ohm cm to 20 ohm cm, more preferably to be 5 ohm cm to 15 ohm cm and most preferably to be 7 ohm cm to 13 ohm cm.

It is presumed that the thickness of the interposed $SiO_2$ film affects the substantial velocity of carriers and the junction coefficient n, and accordingly the number of the carriers which are capable of passing through the $SiO_2$ film in a tunnel like manner decreases exponentially as the film thickness is increased. On the other hand, it is presumed that the junction coefficient n, increases in accordance with the increase of the thickness of the $SiO_2$ film. As a result of experimentation, however, no significant change is found in this respect.

Thus, it is presumed that the deceleration action of the $SiO_2$ film on the carriers affects the reverse saturation current Io. However, when the thickness of the $SiO_2$ film is increased for the purpose of increasing the deceleration action, but is made to large, the photoelectric current (i.e. short circuit current) in a non-bias state of the composite is reduced accordingly.

Figure 8:
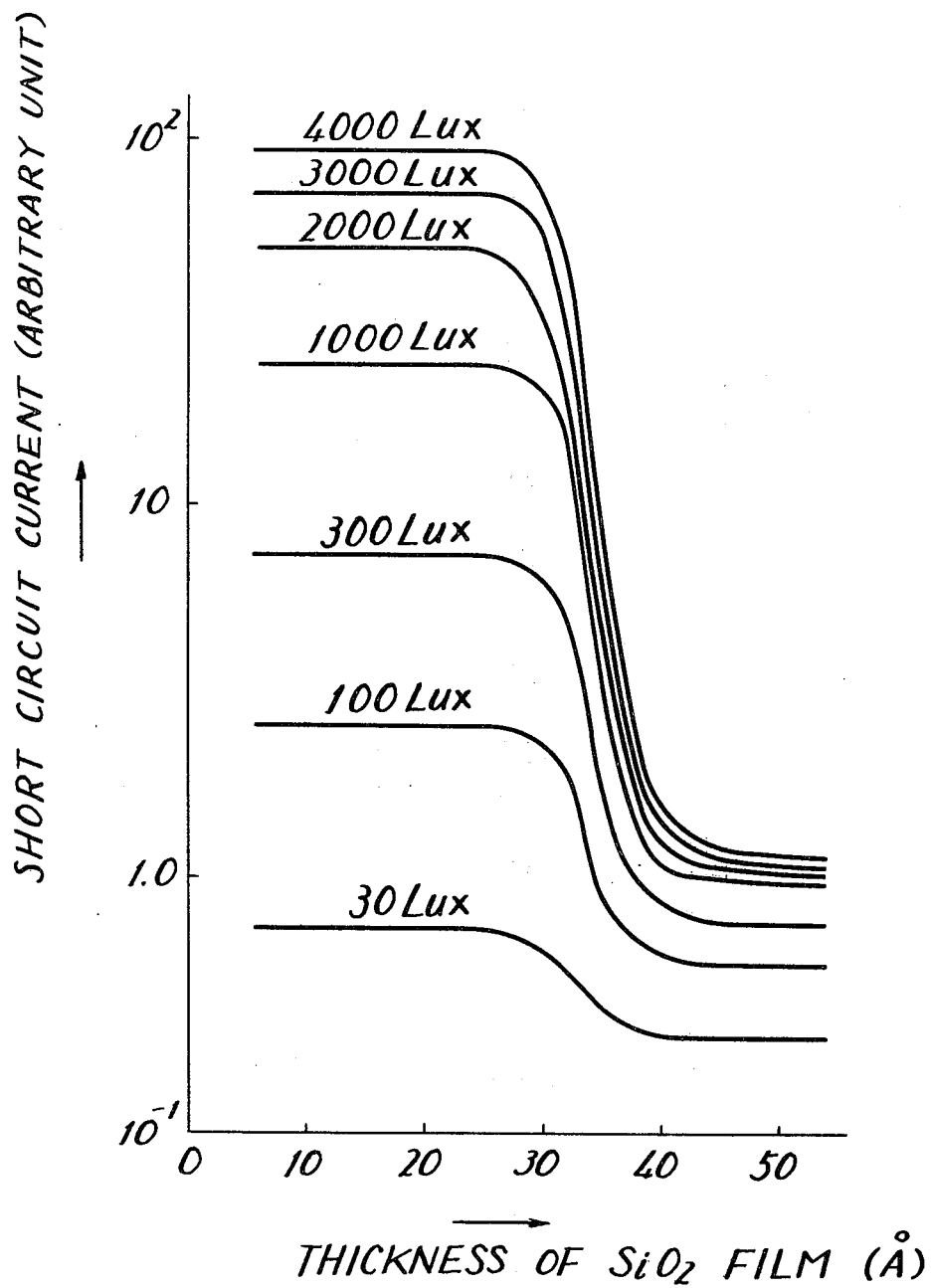
FIG. 8 is a graph showing a relation of the short circuit current with a thickness of the $SiO_2$ film, with various values of illumination impinging upon the composite as a parameter.

FIG. 8 is a graph showing a relation of the short circuit current with the thickness of the $SiO_2$ film, with various values of illumination impinging upon the composite as a parameter. As seen from the graph, the short circuit current of the composite abruptly decreases as the thickness of the $SiO_2$ film exceeds approximately 30A. Thus, it is preferred to choose the thickness of the $SiO_2$ film to be less than approximately 30A., and more preferably to be less than approximately 25A., although within such limits of thickness the thicker the film is formed the more preferred it is. Thus, a preferred range of thickness of the $SiO_2$ film is 15A. to 25A. and a more preferred range is 20A to 25A.

Further consideration will be made of the characteristic in the following.

In further examining the photoelectric characteristic of the composite in the high illumination region, it was observed that the inventive composite shows a higher sensitivity in a visible wavelength region as compared with the conventional PN junction photoelectric device, possibly due to the fact that the barrier of the inventive composite is formed near the light receiving surface, but the tendency of saturation as to the short circuit characteristic of the inventive composite was conspicuous as compared with the conventional PN junction device. The following three reasons are presumed for explanation of the latter mentioned phenomenon.

1. In general, the short circuit current of the semiconductor photoelectric device is proportional to the quantity of light impinging upon the device, but tends to be proportional to the square root of the quantity of light as it is increased. In view of such characteristic of the semiconductor photoelectric device, the PN junction type semiconductor photoelectric device receives the much more decreased light as compared with the inventive heterojunction device, because a rectifying barrier of the PN junction device is formed in a region of the substrate deeper from the light receiving surface as compared with heterojunction device.

2. Since the thickness of the $SnO_2$ film of the inventive device is thinner than 1 micron, the series resistance of the inventive device as a diode is larger as compared with the PN junction device and therefore the loss due to the series resistance is presumed to be conspicuous as the quantity of light becomes larger and thus the short circuit current is decreased accordingly.

3. Generally, a saturating tendency in the short circuit current of the semiconductor photoelectric device is presumed to result from the fact that carriers exited by the incident light increase as the quantity of light is increased and when an increased number of carriers come to possess energy higher than the barrier height $V_D$ of the rectifying junction some of carriers start to flow in a reverse direction, which increases internal consumption of energy.

Of these three reasons, the problem in conjunction with the abovementioned paragraph (1) cannot be avoided. However, the problem of series resistance in conjunction with the above-mentioned paragraph (2) can be solved by proper choice of specific resistivity of the silicon substrate, the thickness of the $SnO_2$ film and the structure of the electrode for withdrawing the electrical output.

The problem of reverse flow of the carriers in conjunction with abovementioned paragraph (3) can be solved by enhancing the barrier height $V_D$ of the rectifying junction. As previously discussed, however, the barrier height $V_D$ can be enhanced by selection of a crystallographic orientation (100) for the junction interface it is understood that such adoption of this crystallographic orientation serves to present reverse flow of the carriers and to expand the linearity region of the short circuit current characteristic at a higher illumination range.

As discussed in brief in the foregoing, the inventors of the present invention discovered the fact that the prior art composite shows an undesirably more increased reverse dark current rather than a linearly proportional reverse dark current, as a barrier area in a single light receiving region is increased. It was observed that the prior art composite of an increased light receiving barrier area shows a much increased reverse dark current and, to be exact, the reverse dark current of the prior art composite is increased in approximate proportion to a square root of the third power of the barrier area, as a light receiving barrier area in a single region is increased.

The fact was also observed that a composite in accordance with the teaching in the referenced patent application shows characteristics similar to the abovementioned ones of the referenced patent composite. If it would be possible to provide a new photoelectric device wherein the abovementioned shortcomings have been eliminated, such a photoelectric device could be used in new and various applications. The present invention provides such a new photoelectric device.

Study was made by experiment by the inventors as to what causes such shortcomings in the prior art composite. As a result, the following reason is presumed as a reason of the said undesirably increased reverse dark current of the large barrier area composite. The inventors noticed that a coefficient of thermal expansion of the $SnO_2$ layer 3 is larger than that of the silicon monocrystalline substrate 1. As is more fully described in the referenced patent and the referenced patent application, the $SnO_2$ layer 3 is deposited on the substrate surface through thermal decomposition of halogenated organic tin at an elevated temperature and the resultant composite is then cooled off to a normal temperature in the process of manufacture thereof. It is therefore believed that tensile force is exerted across the $SnO_2$ layer in the resultant composite and the broader the $SnO_2$ layer is formed, the larger the said tensile force is generated in the layer. As a result, it is apparent that a shearing stress is exerted at the barrier portion between the $SnO_2$ layer and the substrate, which causes an increased reverse dark current to flow. In fact, experimentation has shown that intentional application of the shearing stress at the barrier portion of the composite causes the reverse leakage current to increase. Thus it is presumed that it is the increased barrier area of the composite which causes the increased reverse dark current.

The referenced patent and the referenced patent application teach and disclose formation of the electrode for the $SnO_2$ layer only at a limited area such as a small area of the peripheral portion of the $SnO_2$ layer. Therefore, an increase of the light receiving barrier area accordingly increases series resistance through the layer to the electrode due to an increased current path length. This apparently causes degradation of the photoelectric characteristic of the large barrier area composite, as not biased. Thus, in order to improve the photoelectric characteristic of the large barrier area composite, a certain consideration is necessary to the structure of the composite.

Figure 9:
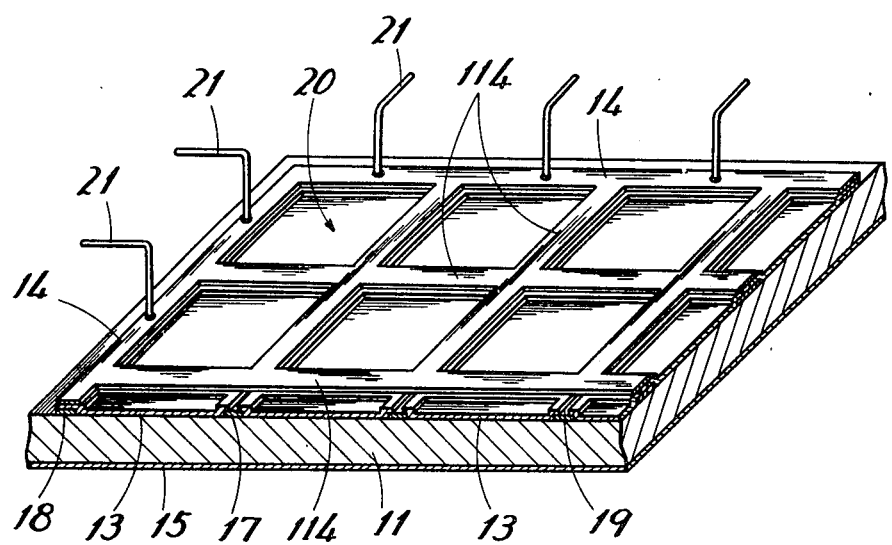
FIG. 9 is a perspective view of a fragmentary end portion of the preferred embodiment of the present invention.

FIG. 9 shows a perspective view of a fragmentary end portion of a preferred embodiment of the present invention. Referring to FIG. 9, a semiconductor photoelectric device of improved photoelectric and rectifying characteristics is provided by first forming films 17 and 18 of electrically insulating material such as silicon dioxide of a substantial thickness on a main surface having a crystallographic orientation (100) of a silicon substrate 11 so as to have a plurality of portions of said main surface exposed through a corresponding plurality of square or rectangle openings laid out at right angles, said openings being defined by said insulating material films 17 and 18, depositing a tin oxide film 13 on the open areas of the silicon substrate with a thin film of $SiO_2$ (not shown) of less than 30A. in thickness intervening therebetween, removing a portion of said tin oxide film just overlying the said insulating film 17, as shown at 19 for separating the respective barrier regions 20 formed between the tin oxide film 13 and the substrate 11, and providing a metal layer 114 and 14 on said insulating film 17 and 18 for connecting the end portions, i.e., peripheral edge portions of the tin oxide films of the adjacent barrier regions. The resultant photoelectric device, having thereby an increased total light receiving area, shows an improved photoelectric characteristic at low and high levels of illumination.

Since the electrodes 14 and 114 are formed outside the area in which the barrier 20 is formed, the entire barrier formed in the chip is effectively utilized in the photoelectric device. Pressure applied to the electrode 14 in attaching a lead wire thereto does not affect the rectifying characteristic. No barrier is formed underneath the electrodes, 17 and 18 which are deposited on a portion of the SnO₂ film 13 above the insulating silicon dioxide films 17 and 18. Another advantage of the inventive composite of the shown embodiment is that it is stable under the influence of outside atmosphere for a long time, because the end or peripheral portions of the barrier are defined and protected by the silicon dioxide films 17 and 18.

It is understood that the resultant composite in accordance with the shown embodiment of the present invention comprises a plurality of small square or rectangle light receiving barrier areas 20 laid out at right angles, while separated from each other by the gap 19 formed on the strip insulating film 17 but connected in parallel with each other by means of the electrode 114, so that a composite of new structure having substantially the same light receiving barrier area as that of the prior art composite of broadened area in a single barrier region is provided.

It is observed that the reverse dark current of the inventive device is only increased in linear proportion to the light receiving barrier area thereof, while that of the prior art device is undesirably more increased.

The reason of improvement in the characteristics of the inventive device as mentioned above may be explained as follows. Division of the light receiving barrier area into a plurality of small areas with a gap intervening between each other eliminates tensile force exerted across the SnO₂ film and thus reduces a shearing stress applied at the barrier portion, with the result of reducing the total of the reverse dark current of the inventive device as compared with that of the prior art, on the assumption of the same total light receiving barrier area. On the other hand, provision of the electrode 114 extending along the gap 19 between a plurality of small light receiving areas provides a current path of low resistance, with the result that series resistance through the SnO₂ layer throughout the device is reduced and thus the photoelectric characteristic of the device as not biased, or biased with a small value, is improved.

While specific preferred embodiments of the invention have been described, it will be apparent that obvious variations and modifications of the invention will occur to those of ordinary skill in the art from a consideration of the foregoing description. It is, therefore, desired that the present invention be limited only by the appended claims.

What is claimed is:

1. A semiconductor photoelectric device comprising:
   a silicon substrate having a main surface of (100) crystallographic orientation,
   a film of an insulating material selected from the group consisting of SiO₂, Si₃N₄, GeO₂ and Al₂O₃, deposited on said main surface of the substrate,
   a tin oxide layer deposited on said insulating material and defining a heterojunction barrier with said substrate,
   and metal electrodes deposited on said tin oxide layer and the substrate, said semiconductor device having a rectifying characteristic and being responsive to incident illumination received through said tin oxide layer at said heterojunction barrier.

2. The semiconductor photoelectric device in accordance with claim 1, in which said insulating material is SiO₂.

3. The semiconductor photoelectric device in accordance with claim 2, in which the thickness of said insulating material layer is selected to be in the range of from 15A. to 30A.

4. The semiconductor photoelectric device in accordance with claim 2, in which the thickness of said insulating material layer is selected to be in the range of from 15A. to 25A.

5. The semiconductor photoelectric device in accordance with claim 2, in which the thickness of said insulating material layer is selected to be in the range of from 20 A. to 25 A.

6. The semiconductor photoelectric device in accordance with claim 1, in which specific resistivity of the substrate is selected to be in the range of from 1 to 20 ohm cm.

7. The semiconductor photoelectric device in accordance with claim 1, in which specific resistivity of the substrate is selected to be in the range of from 5 to 15 ohm cm.

8. The semiconductor photoelectric device in accordance with claim 1, in which specific resistivity of the substrate is selected to be in the range of from 7 to 13 ohm cm.

9. The semiconductor photoelectric device in accordance with claim 1, in which said tin oxide layer deposited on the main surface of said substrate comprises a plurality of separate layers deposited on a corresponding plurality of areas of said substrate with the periphery of each said separate layer spaced apart from the peripheries of adjacent said layers of said plurality thereof and defining a corresponding plurality of separate heterojunction barriers, each having a rectifying characteristic and which further comprises means connected to the peripheries of said separate tin oxide layers for forming an electrically common connection to the said plurality of separate tin oxide layers.

10. The semiconductor photoelectric device in accordance with claim 9, which further comprises a second insulating film of substantial thickness formed on said main surface of said substrate for defining said plurality of separate areas of said main surface of said substrate, said plurality of separate tin oxide layers deposited on said corresponding separate areas of said main surface of said substrate having the peripheral edges thereof overlying said second insulating film defining the corresponding area, and said respective peripheries of said adjacent ones of said plurality of tin oxide layers being spaced apart on said second insulating film, and said means forming an electrically common connection comprising a layer of conductive material deposited onto said peripheral edges of said separate layers, said second insulating film being of a thickness sufficient to electrically insulate said layer of conductive material from said substrate.

11. A semiconductor photoelectric device comprising:
   a silicon substrate having a main surface of (100) crystallographic orientation,
   a relatively thick insulating film formed on a portion of said main surface of said substrate in a pattern to define a plurality of exposed areas of said main surface of said substrate,
   a plurality of thin films of an insulating material selected from the group consisting of SiO₂, Si₃N₄, GeO₂ and Al₂O₃, deposited on respectively corresponding ones of said plurality of exposed areas of said main surface of said substrate and of a thickness in the range of from 15A. to 30A., a plurality of separate tin oxide layers deposited on respectively corresponding ones of said relatively thin films of said exposed areas with the peripheral edges of each said separate layer deposited on said relatively thick film of insulating material defining the corresponding said exposed area and spaced from the peripheral edges of adjacent said separate layers to define thereby a corresponding plurality of separate heterojunction barriers each having a rectifying characteristic, a metal electrode deposited on said peripheral edges of said plurality of separate tin oxide layers and on said relatively thick insulating material between said spaced apart peripheral edges of said plurality of separate tin oxide layers to provide a common electrical connection to said plurality of separate tin oxide layers, said relatively thick film being of a thickness sufficient to electrically insulate said metal electrode from said substrate, and said device being responsive to incident illumination received through said tin oxide layers at said heterojunction barriers.

12. The semiconductor photoelectric device as recited in claim 11, wherein said relatively thick insulating film includes a portion thereof deposited on the peripheral edge portion of said main surface of said substrate and further comprising electrical connectors connected to the metal electrode deposited on the peripheral edge portions of said tin oxide layers which are deposited on said portion of said second insulating film at said peripheral edge portion of said main surface of said substrate.

13. A semiconductor photoelectric device comprising:

a silicon substrate havig a main surface of (100) crystallographic orientation, a relatively thick insulating film formed on a portion of said main surface of said substrate to define an exposed area of said main surface of said substrate, a thin film of an insulating material selected from the group consisting of SiO₂, Si₃N₄, GeO₂ and Al₂O₃, deposited on said exposed area of said main surface of said substrate and of a thickness in the range of from 15A. to 30A., a tin oxide layer deposited on said thin film of said exposed area, said tin oxide layer and said exposed area defining a heterojunction barrier having a rectifying characteristic, the peripheral edges of said tin oxide layer being deposited on said relatively thick film of insulating material and said relatively thick film electrically insulating said peripheral edges of said tin oxide layer from said main surface of said substrate, a metal electrode deposited on at least a portion of at least one peripheral edge of said tin oxide layer to provide an electrical connection to said tin oxide layer, and said device being responsive to incident illumination received through said tin oxide layer at said heterojunction barrier.

* * * * *

UNITED STATES PATENT AND TRADEMARK OFFICE
CERTIFICATE OF CORRECTION

PATENT NO. : 3,952,323
DATED : April 20, 1976
INVENTOR(S) : Shigeru Tanimura et al It is certified that error appears in the above–identified patent and that said Letters Patent are hereby corrected as shown below:

Column 2, line 66, change "as" to --has--.
Column 3, line 7, delete "or".
Column 3, line 43, change "2A" to --27A--.
Column 9, line 40, delete "such".
Column 9, line 41, change "present" to --prevent--.
Column 9, line 47, delete "more".

Signed and Sealed this

Sixth Day of July 1976

[SEAL]

Attest:

RUTH C. MASON
Attesting Officer

C. MARSHALL DANN
Commissioner of Patents and Trademarks